United States Patent
Yang et al.

(10) Patent No.: US 9,018,032 B2
(45) Date of Patent: Apr. 28, 2015

(54) CIGS SOLAR CELL STRUCTURE AND METHOD FOR FABRICATING THE SAME

(75) Inventors: Hsuan-Sheng Yang, Taichung (TW);
Wen-Chin Lee, Hsinchu (TW);
Li-Huan Chu, Hsin Chu (TW)

(73) Assignee: TSMC Solar Ltd., Taichung (TW)

( * ) Notice: Subject to any disclaimer, the term of this patent is extended or adjusted under 35 U.S.C. 154(b) by 211 days.

(21) Appl. No.: 13/445,997

(22) Filed: Apr. 13, 2012

(65) Prior Publication Data

US 2013/0269778 A1    Oct. 17, 2013

(51) Int. Cl.
*H01L 21/00*    (2006.01)
*H01L 21/02*    (2006.01)
*H01L 31/032*    (2006.01)
*H01L 31/0749*    (2012.01)

(52) U.S. Cl.
CPC .... *H01L 21/02491* (2013.01); *H01L 21/02568* (2013.01); *H01L 21/02614* (2013.01); *H01L 31/0322* (2013.01); *H01L 31/0749* (2013.01); *Y02E 10/541* (2013.01)

(58) Field of Classification Search
CPC ................. H01L 21/02568; H01L 31/0322; H01L 31/18
USPC ................. 438/57, 84, 85, 93–95
See application file for complete search history.

(56) References Cited

U.S. PATENT DOCUMENTS

| | | |
|---|---|---|
| 6,258,620 B1 | 7/2001 | Morel et al. |
| 2010/0236616 A1 | 9/2010 | Chuang |
| 2011/0017289 A1 | 1/2011 | Park et al. |
| 2011/0086465 A1 | 4/2011 | Chuang |
| 2011/0192463 A1 | 8/2011 | Chuang |

*Primary Examiner* — Thanhha Pham
(74) *Attorney, Agent, or Firm* — Duane Morris LLP

(57) ABSTRACT

A method for manufacturing a CIGS thin film photovoltaic device includes forming a back contact layer on a substrate, forming an Se-rich layer on the back contact layer, forming a precursor layer on the Se-rich layer by depositing copper, gallium and indium resulting in a first interim structure, annealing or selenizing the first interim structure, thereby forming Cu/Se, Ga/Se or CIGS compounds along the interface between the back contact layer and the precursor layer and resulting in a second interim structure, and selenizing the second interim structure, thereby converting the precursor layer into a CIGS absorber layer on the back contact layer.

20 Claims, 3 Drawing Sheets

CIGS SOLAR CELL STRUCTURE AND METHOD FOR FABRICATING THE SAME

FIELD

This disclosure relates generally to a copper/indium/gallium/selenium solar cell structure and a method for fabricating the same.

BACKGROUND

In conventional architecture for a copper/indium/gallium/selenium ("CIGS") thin film solar cell, the thin film stack generally consists of a substrate, a molybdenum ("Mo") thin film layer as a back contact layer (a.k.a., back electrode), and a CIGS thin film layer as the absorber layer. The structure further includes a buffer layer of CdS, for example, then followed by a top electrode layer. Such conventional structure is formed by first depositing the molybdenum thin film layer over the substrate. The CIGS thin film absorber layer is formed by deposition of a Cu/In/Ga (CIG) intermetallic precursor layer on the Mo thin film layer and followed by selenization and optionally sulfurization of the CIG precursor in a furnace, thus, converting the CIG precursor layer into the final CIGS/S layer. However, the resulting CIGS/S layer formed on the molybdenum thin film layer often exhibit voids at the interface between the CIGS/S layer and the molybdenum layer accompanied by delamination or peeling of the CIGS/S layer.

Cu/Ga intermetallic compounds may be formed at the Mo/precursor interface. These intermetallic compounds are believed to result in void formation at the interface. The voids between the CIGS absorber layer and the back contact layer are undesirable because they weaken the interface between the Mo back contact layer and the CIGS absorber layer.

Figure 1:
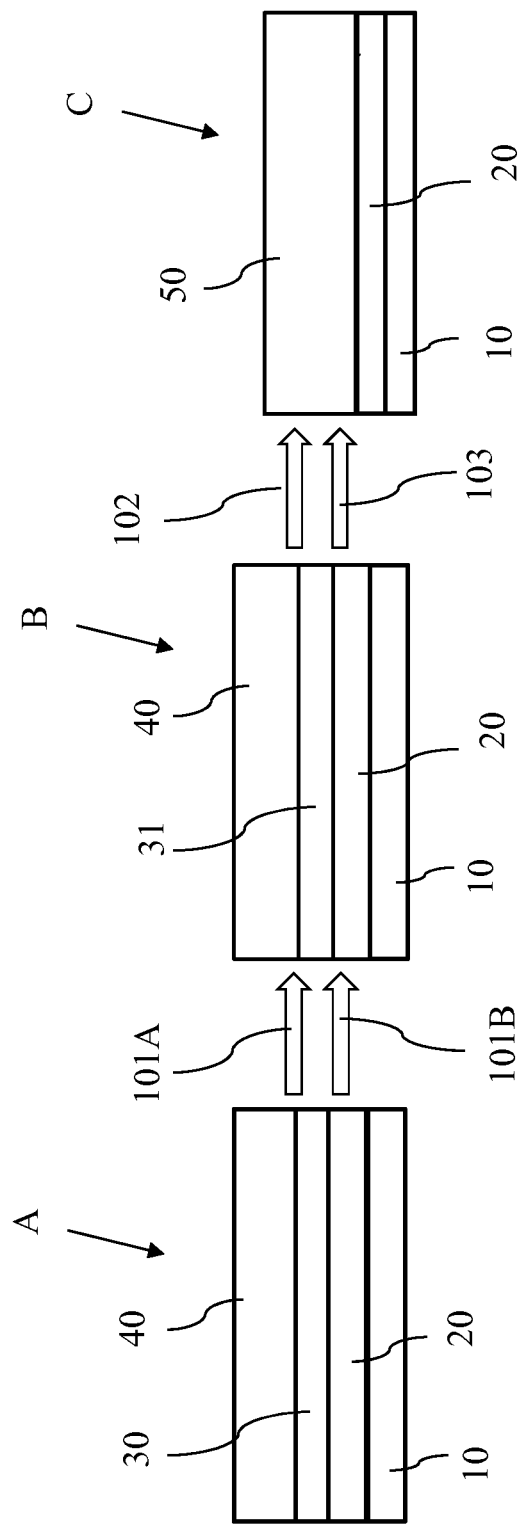
FIG. 1 illustrates the CIGS process according to the present disclosure.

All drawing are schematic and are not to scale and they are not intended to show actual dimensions.

DETAILED DESCRIPTION

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

CIGS thin film solar cells are one type of low cost solar cells. Copper indium gallium selenide ($CuIn_{1-x}Ga_xSe_2$ or CIGS) is a direct bandgap semiconductor useful for the manufacture of solar cells. Because the material strongly absorbs sunlight, a much thinner film is required than of other semiconductor materials. The CIGS absorber is commonly formed on a substrate as a backing material, along with electrodes to collect current. The substrate is generally a glass substrate or a flexible metal substrate. CIGS' absorption coefficient is higher than any other semiconductor used for solar modules. A thin film of molybdenum layer is deposited by sputtering which serves as the back contact and to reflect most unabsorbed light back into the CIGS absorber. Following the molybdenum deposition, a p-type CIGS absorber layer is formed by one of several unique methods that include formation of CIGS through selenization of CIGS precursor in $H_2Se$. A thin passivation layer of n-type material is generally formed on top of the CIGS absorber layer. The passivation layer can be CdS deposited via chemical bath deposition after the selenization step. In some processes the passivation is achieved without the use of Cd by performing selenization in $H_2Se$ followed by sulfurization in $H_2S$. The sulfurization step appears to passivate the surface in a way similar to CdS without the toxicity and environmental effects of Cd. Generally, the passivation layer is then overlaid with a thin, intrinsic ZnO layer which is capped by a thicker, Al doped ZnO layer. The ZnO and Al doped ZnO form a transparent contact layer (i.e., an electrode) on the front side of the solar cell. The front side refers to the side that is facing the incident electromagnetic waves such as sunlight.

The present disclosure provides a method for forming Se-rich layer at the interface of CIGS precursor layer and the back contact in a CIGS thin film solar cell which enhances the CIGS absorber layer film quality and adhesion between the back contact and the CIGS absorber layer. The method includes forming a back contact layer on a substrate, forming an Se-rich layer on the back contact layer, forming a precursor layer on the Se-rich layer by depositing copper, gallium and indium resulting in a first interim structure, annealing or selenizing the first interim structure, thereby forming Cu/Se, Ga/Se or CIGS compounds along the interface between the back contact layer and the precursor layer and resulting in a second interim structure, and selenizing the second interim structure, thereby converting the precursor layer into a CIGS absorber layer on the back contact layer.

Referring to FIG. 1, in a method for manufacturing a CIGS thin film solar cell according to an embodiment of the present disclosure, a back contact layer 20 is deposited on a substrate 10. The back contact layer 20 is a molybdenum layer and is commonly deposited by sputtering. The back contact layer reflect most unabsorbed light back into the CIGS absorber layer. An Se-rich layer 30 is then deposited over the back contact layer 20. The Se-rich layer 30 can be a layer of Se element or a film of $MoSe_2$, $In_2Se_3$, CuSe or GaSe compounds such as $MoSe_2$, $In_2Se_3$.

A CIG precursor layer 40 of Cu/In/Ga is deposited over the Se-rich layer 30 resulting in the first intermediate structure A. The CIG precursor layer 40 is deposited by synchronizing evaporation deposition or a selenization process. This generally involves depositing at least one Class IB element (e.g., copper), at least one Class IIIA element (e.g., indium and gallium), and at least one Class VIA element (e.g., selenium), onto the Se-rich layer 30. The CIG precursor deposition process is well-known in the art.

Next, the first intermediate structure A is selenized in a $H_2Se$ or other gaseous Se rich environment in some embodiments. This processing step is represented by the arrow 101A. During the selenization step 101A, Se from the selenization gas and the Se-rich layer 30 react with the CIG precursor 40 and form Cu/Se, Ga/Se, or CIGS compounds 31 along the interface of the back contact layer 20 and the CIG precursor layer 40. Because the Se-rich layer 30 acts as the seed for the formation of the Cu/Se, Ga/Se, or CIGS compounds, the compounds are generally uniformly distributed along the interface of the back contact 20 and the CIG precursor layer 40. Thus, the provision of the Se-rich layer 30 suppresses the formation of the undesired Cu/Ga intermetallic compound at the Mo/CIG interface. The result is the second interim structure B.

If sufficient amount of Se is provided by the Se-rich layer 30, additional Se source is not necessary to form the Cu/Se, Ga/Se, or CIGS compounds along the interface between the back contact 20 and the CIGS precursor 40 during the transformation of the first interim structure A into the second interim structure B. In other words, the first interim structure A can be processed through an annealing step 101B, rather than the selenization process step 101A.

The amount of Se from the Se-rich layer 30 that would be sufficient to do without the selenization step 101A would depend on the amount of Cu, In, and Ga in the CIGS precursor 40. The range of the amount of Se can be from 0.5 to 1.2 of Se/(Cu+In+Ga) ratio. The annealing step 101B would be conducted at a temperature in the range between 300° C. and 600° C. For the Se-rich layer material like $MoSe_2$, however, the Se-rich layer 30 is preferably not too thick because too much Mo can alter the composition of the resulting CIGS and also affect the adhesion between the resulting CIGS layer 50 and the back contact layer 20.

The Se-rich material can be deposited using any of the known technologies, such as evaporation, sputtering, or depositing in reactive gas of $H_2Se$. The Se-rich layer can be as thick as several hundred nanometers if $In_2Se_3$ or Se is used because these materials are compatible with the precursor materials (Cu/In/Ga) for the CIGS absorber layer.

According to one embodiment, the Se-rich material 30 can be deposited at the end of the Mo deposition for the back contact layer 20 in the same sputtering chamber. This can be achieved using a multiple-target sputter chamber where one target is Mo and another target is the Se-rich material. Upon completion of the Mo sputtering, the Se-rich material 30 can be sputtered onto the Mo layer. Similarly, in another embodiment, the Se-rich material can be deposited at the beginning of the CIG precursor layer deposition in the same sputter chamber. In this case, a multiple-target chamber is provided with a Se-rich material target in addition to the targets for the CIG precursor materials. The Se-rich material 30 is sputtered first to deposit a layer of the Se-rich material on the Mo back contact layer. Then, the CIG precursor materials 40 are deposited.

Next, the second interim structure B is processed through a second selenization step 102 and convert the CIGS precursor layer 40 into a CIGS absorber layer 50. The second selenization process step 102 can also be combined with an optional sulfurization process 103 to further enhance the formation of the CIGS absorber layer 50. Generally, the composition of the CIGS absorber layer 50 $Cu_yIn_{(1-x)}Ga_xSe_2$, where y=0.75~1.0 and x=0.15~0.35.

Thus, the resulting structure C shown in FIG. 1 represents the CIGS solar cell structure according to an embodiment of the present disclosure. As mentioned above, the benefits of the provision of the Se-rich layer 30 between the back contact layer 20 and the CIG precursor 40 is the suppression of the formation of the undesirable Cu/Ga, In/Ga or Cu/In intermetallic compounds at the interface of back contact layer 20 and the CIG precursor 40 in the absence of such Se-rich layer 30 during the annealing process (the step 240 mentioned above).

Elimination of the Cu/Ga, In/Ga or Cu/In intermetallic compounds at the interface between the back contact layer and the CIG precursor layer prevents formation of voids during the subsequent selenization or the optional selenization & sulfurization process steps (the steps 250 or 255 mentioned above).

Figure 2:
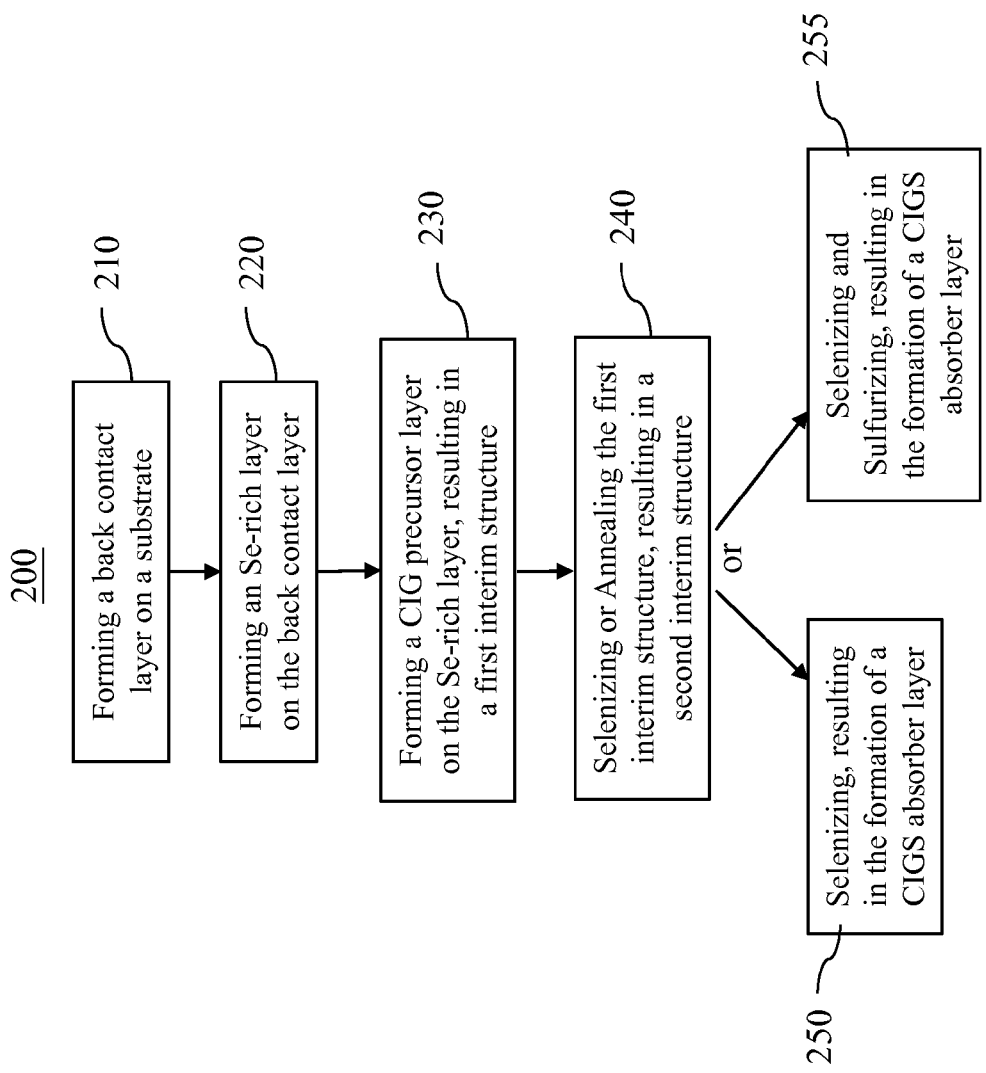
FIG. 2 is a flow chart for the method of the present disclosure.

FIG. 2 presents this process in a flow chart 200. In step 210, a back contact layer is formed on a substrate, for example, a Mo back contact layer 20 is formed on the glass substrate 10. In step 220, an Se-rich layer is formed on the back contact layer, for example, the Se-rich layer 30 is formed on the back contact layer 20. In step 230, a CIG precursor layer is formed on the Se-rich layer to form a first interim structure. As an example, the CIG precursor layer 40 is formed on the Se-rich layer 30 by depositing Cu, Ga and In, resulting in the first interim structure A as shown in FIG. 1. In step 240, the first interim structure is selenized or annealed to form a second interim structure. The first interim structure A of FIG. 1 is selenized (selenization step 101A) or annealed (annealing step 101B), depending upon the amount of Se provided by the Se-rich layer 30, and form the second interim structure B. In step 250, the second interim structure B is selenized (second selenization process step 102), thus forming the CIGS absorber layer 50 on the Mo back contact layer 20. Alternatively, in step 255, the second interim structure B can be selenized (second selenization process step 102) and sulfurized (sulfurization process 103) to form a $CuInGa(SSe)_2$ ("CIGSS") absorber layer 50 on the Mo back contact layer 20.

As described above, without being bound by a particular theory, the inventors believe that in the conventional CIGS process, Se diffuses into the CIG precursor layer from the outer surface because $H_2Se$ gas or S on top of the CIG precursor is the only source of Se. As result the underside region of the CIG precursor layer is Se-poor (i.e., has a low concentration of Se), which promotes the formation of the Cu/Ga, In/Ga or Cu/In intermetallic compounds at the interface between the CIG precursor and the back contact layer. The provision of the Se-rich layer according to the present disclosure provides a supply of Se to the CIG precursor layer from the underside of the CIG precursor and suppresses the formation of the Cu/Ga, In/Ga or Cu/In intermetallic compounds. Next, the interim structure is selenized, thus forming a CIGS absorber layer on the back contact layer. Alternatively, in step 255, the interim structure can be selenized and sulfurized. As described above in the BACKGROUND, the sulfurization step provides an option of forming a Cd-free n-type passivation layer on top of the CIGS absorber layer. The passivation layer can be then overlaid with a transparent contact layer to form the front side of the solar cell device. The transparent contact layer generally comprises a thin intrinsic ZnO layer which is capped by a thicker, Al doped ZnO layer.

Figure 3:
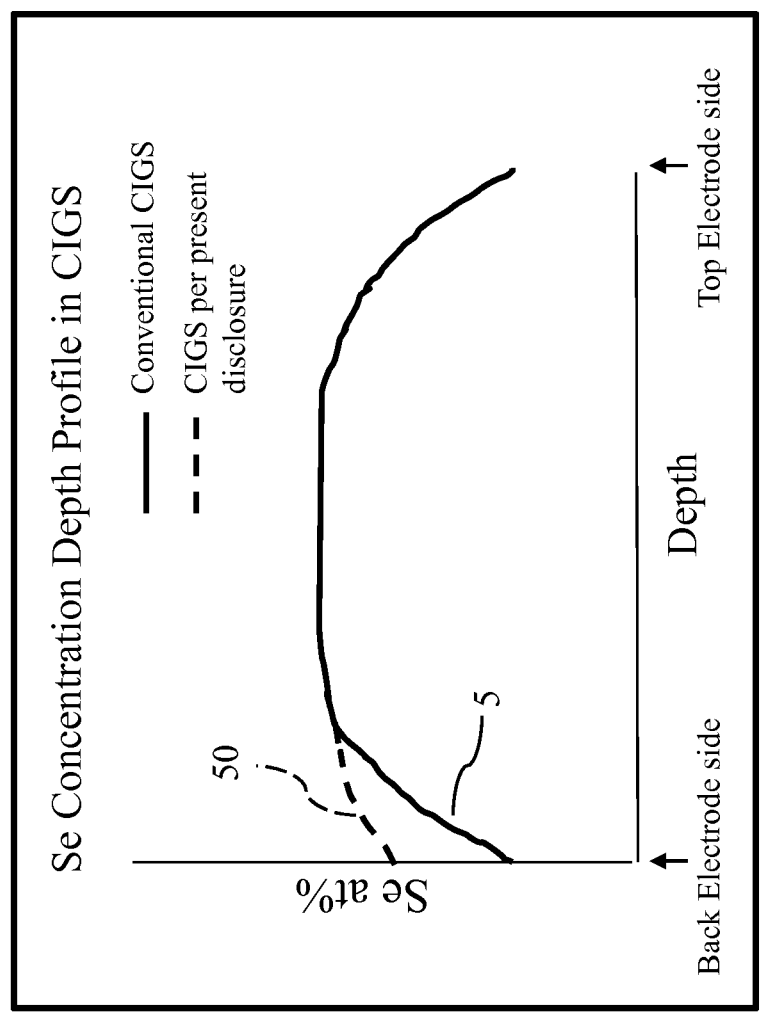
FIG. 3 shows the depth profile of Se in the CIGS layer.

FIG. 3 shows a comparison of the calculated depth profiles of Se in a CIGS absorber layer 5 that is formed using a conventional process and a second CIGS absorber layer 50 that is formed using the process according to the present disclosure. As shown, the process of the present disclosure increases the concentration of Se near the back contact side of the CIGS absorber layer. In one embodiment, the concentration of Se in the CIGS absorber layer at the back contact interface is from 30 to 60 atomic %.

According to an embodiment, a method for manufacturing a thin film photovoltaic device comprising the steps of providing a substrate, forming a back contact layer on the substrate, forming an Se-rich layer on the back contact layer, forming a precursor layer on the Se-rich layer by depositing copper, gallium and indium resulting in an interim structure, annealing the interim structure; and selenizing the interim structure, thus forming a CIGS absorber layer on the back contact layer.

According to another embodiment, a method for manufacturing a thin film photovoltaic device comprising the steps of providing a substrate, forming a back contact layer on the substrate, forming an Se-rich layer on the back contact layer, forming a precursor layer on the Se-rich layer by depositing copper, gallium and indium resulting in an interim structure, selenizing and annealing the interim structure, and sulfurizing the interim structure, thus forming a CIGSS absorber layer on the back contact layer. As mentioned above, the annealing is conducted at a temperature in the range between 300° C. and 600° C.

The advantages of the method described herein are by suppressing Cu/Ga intermetallic compound formation, void, which generated by Cu/Ga intermetallic compounds diffused into CIGS film, can be reduced or eliminated. Also Se provided from the bottom of the precursor can form Cu/Se and Ga/Se compounds, which can also increase CIGS synthesis rate, which is limited by Se diffusion rate of the traditional SAS process.

Although the subject matter has been described in terms of exemplary embodiments, it is not limited thereto. Rather, the appended claims should be construed broadly, to include other variants and embodiments, which may be made by those skilled in the art.

What is claimed is:

1. A method for manufacturing a thin film photovoltaic device comprising the steps of:
    (a) forming a back contact layer on a substrate;
    (b) forming an Se-rich layer on the back contact layer;
    (c) forming a precursor layer on the Se-rich layer by depositing copper, gallium and indium resulting in a first interim structure;
    (d) annealing the first interim structure, thereby forming Cu/Se, Ga/Se or CIGS compounds along the interface between the back contact layer and the precursor layer and resulting in a second interim structure; and
    (e) selenizing the second interim structure, thereby converting the precursor layer into a CIGS absorber layer on the back contact layer.

2. The method of claim 1, wherein the step (e) further includes sulfurizing the second interim structure concurrently with the selenizing step.

3. The method of claim 1, wherein the forming of the Se-rich layer comprises depositing a film of Se.

4. The method of claim 1, wherein the forming of the Se-rich layer comprises depositing a film of MoSe compound.

5. The method of claim 1, wherein the forming of the Se-rich layer comprises depositing a film of InSe compound.

6. The method of claim 1, wherein the forming of the Se-rich layer comprises depositing a film of CuSe compound.

7. The method of claim 1, wherein the forming of the Se-rich layer comprises depositing a film of GaSe compound.

8. The method of claim 1, wherein the annealing is conducted at a temperature in a range between 300° C. and 600° C.

9. The method of claim 1, wherein the CIGS absorber layer has an Se concentration of 30 to 60 atomic % along its interface with the back contact layer.

10. The method of claim 1, wherein the second interim structure is selenized in $H_2Se$.

11. The method of claim 2, wherein the second interim structure is sulferized in $H_2S$.

12. A method for manufacturing a thin film photovoltaic device comprising the steps of:
    (a) forming a back contact layer on a substrate;
    (b) forming an Se-rich layer on the back contact layer;
    (c) forming a precursor layer on the Se-rich layer by depositing copper, gallium, and indium resulting in a first interim structure;
    (d) selenizing the first interim structure, thereby forming Cu/Se, Ga/Se or CIGS compounds along the interface between the back contact layer and the precursor layer and resulting in a second interim structure; and
    (e) selenizing the second interim structure, thereby converting the precursor layer into a CIGS absorber layer on the back contact layer.

13. The method of claim 12, wherein the step (e) further includes sulfurizing the second interim structure concurrently with the selenizing step.

14. The method of claim 12, wherein the forming of the Se-rich layer comprises depositing a film of Se.

15. The method of claim 12, wherein the forming of the Se-rich layer comprises depositing a film of MoSe compound.

16. The method of claim 12, wherein the forming of the Se-rich layer comprises depositing a film of InSe compound.

17. The method of claim 12, wherein the forming of the Se-rich layer comprises depositing a film of CuSe compound.

18. The method of claim 12, wherein the forming of the Se-rich layer comprises depositing a film of GaSe compound.

19. The method of claim 12, wherein the CIGS absorber layer has an Se concentration of 30 to 60 atomic % along its interface with the back contact layer.

20. The method of claim 12, wherein the second interim structure is selenized in $H_2Se$.

* * * * *